(12) United States Patent
Noguchi

(10) Patent No.: US 6,437,403 B1
(45) Date of Patent: Aug. 20, 2002

(54) SEMICONDUCTOR DEVICE

(75) Inventor: Takashi Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/474,899

(22) Filed: Dec. 30, 1999

(30) Foreign Application Priority Data

Jan. 18, 1999 (JP) .......................................... 11-009683

(51) Int. Cl.$^7$ .............................................. H01L 27/01
(52) U.S. Cl. ..................... 257/347; 257/352; 257/353; 257/616
(58) Field of Search ................................ 257/616, 347, 257/352, 353; 438/163, 166, 164, 412

(56) References Cited

U.S. PATENT DOCUMENTS

| | | | | |
|---|---|---|---|---|
| 4,882,252 A | * | 11/1989 | Kawamura ..................... 430/57 |
| 4,904,611 A | * | 2/1990 | Chiang ......................... 437/21 |
| 4,975,387 A | * | 12/1990 | Prokes ......................... 437/131 |
| 5,282,993 A | * | 2/1994 | Karg ............................ 257/56 |
| 5,290,712 A | * | 3/1994 | Sato ............................. 437/24 |
| 5,457,058 A | * | 10/1995 | Yonehara ....................... 437/24 |
| 5,521,108 A | * | 5/1996 | Rostoker ....................... 437/43 |
| 5,627,086 A | * | 5/1997 | Noguchi ....................... 438/162 |
| 5,710,050 A | * | 1/1998 | Makita .......................... 437/21 |
| 6,028,333 A | * | 2/2000 | Yamazaki ..................... 257/296 |
| 6,124,614 A | * | 9/2000 | Ryum .......................... 257/347 |

* cited by examiner

*Primary Examiner*—Olik Chaudhuri
*Assistant Examiner*—Nathan W. Ha
(74) *Attorney, Agent, or Firm*—Sonnenschein, Nath & Rosenthal

(57) ABSTRACT

A semiconductor device has a nMOS transistor and a pMOS transistor formed on a substrate made of glass or plastics with buffer layer in between. The nMOS transistor has a conduction region made of polycrystal Si and a gate electrode associated therewith, while the pMOS transistor has a conduction region made of polycrystal Si and a gate electrode associated therewith. The gate electrodes are made of p-type SiGe or P-type Ge. The relation between the gate length L or the gate width W of the gate electrodes and the average grain size d of the conduction regions associated therewith is given by: L≦d, W>d. The semiconductor device exhibits the small range of variations in characteristics even if the gate length is reduced. Also, speed-up and voltage reduction can be achieved.

20 Claims, 5 Drawing Sheets

SEMICONDUCTOR DEVICE

RELATED APPLICATION DATA

The present application claims priority to Japanese Application No. P11-009683 filed Jan. 12, 1999, which application is incorporated herein by reference to the extent permitted by law.

BACKGROUND OF THE INVENTION

1. Field of the Invention

The invention relates to a semiconductor device having a conduction region made of polycrystal semiconductor and a gate electrode associated with the conduction region.

2. Description of the Related Art

In the related art, semiconductor devices such as a LSI (Large Scale Integrated circuit) are manufactured through forming transistors or other components directly on a single crystal silicon substrate. Since such semiconductor devices are formed on a single crystal substrate, the size thereof is limited to the wafer size. Moreover, they are fragile. Also, semiconductor devices as thus manufactured have limits in speed-up and voltage reduction through a scale-down, because of the junction capacitance of transistors.

In order to reduce the parasitic capacity of transistors, researches have been made on the technology for forming a semiconductor device on a SOI (Silicon on Insulator), or a substrate manufactured through forming a thin film of single crystal silicon on an insulating film. However, forming a single crystal thin film on an insulating film is difficult and thus SOIs are expensive. Also, since SOIs in development are manufactured by using wafers, it is not possible to obtain a semiconductor device of larger size than a wafer.

Researches have been also made on another technology for reducing the parasitic capacity of transistors through forming a semiconductor device on a thin film of polycrystal silicon which is formed on an insulating substrate. Polycrystal thin films can be formed on large substrates made of glass or other materials by the newest ELA (excimer laser annealing) (see Extended Abstracts of IC SSDM, p. 620, c1991, by T. Noguchi et al). It is therefore expected that the latter technology will achieve a system on panel, or a system having a LCD liquid crystal display) and a control LSI provided on one substrate (see NIKKEI MICRO DEVICE, February 1997, p. 90).

However, if a semiconductor device is manufactured by using polycrystal thin films, the conduction regions of transistors are made of polycrystal. This causes a problem of variations in characteristics due to grain boundary in the case of a scale-down of the conduction regions (see Jap. J. Appl. Phys., Vol. 32 (1993) L1584, by T. Noguchi). Due to the variations, the scaling law of MOS transistors can not be applied, just as it is, to semiconductor devices manufactured by using polycrystal thin films. Thus scale-down, i.e. speed-up and voltage reduction, of semiconductor devices becomes difficult.

SUMMARY OF THE INVENTION

The present invention has been made to overcome the above-described problems. It is an object of the invention to provide a semiconductor device in which variations in characteristics is reduced and thus speed-up and voltage reduction can be achieved.

A semiconductor device according to the present invention comprises a source and a drain provided apart from each other, a conduction region made of polycrystal semiconductor and provided next to both of the source and the drain, and a gate electrode associated with the conduction region, the gate length of the gate electrode being smaller than or equal to the average grain size of the conduction region, while the gate width of the gate electrode being greater than the average grain size of the conduction region.

In the semiconductor device according to the present invention, the gate length of the gate electrode is smaller than or equal to the average grain size of the conduction region, while the gate width is greater than the average grain size of the conduction region. Therefore, the semiconductor device exhibits the small range of variations in characteristics even if the gate length is reduced. As a result, speed-up and voltage reduction can be achieved.

Other and further objects, features and advantages of the invention will appear more fully from the following description.

DETAILED DESCRIPTION OF THE PREFERRED EMBODIMENTS

Figure 1:
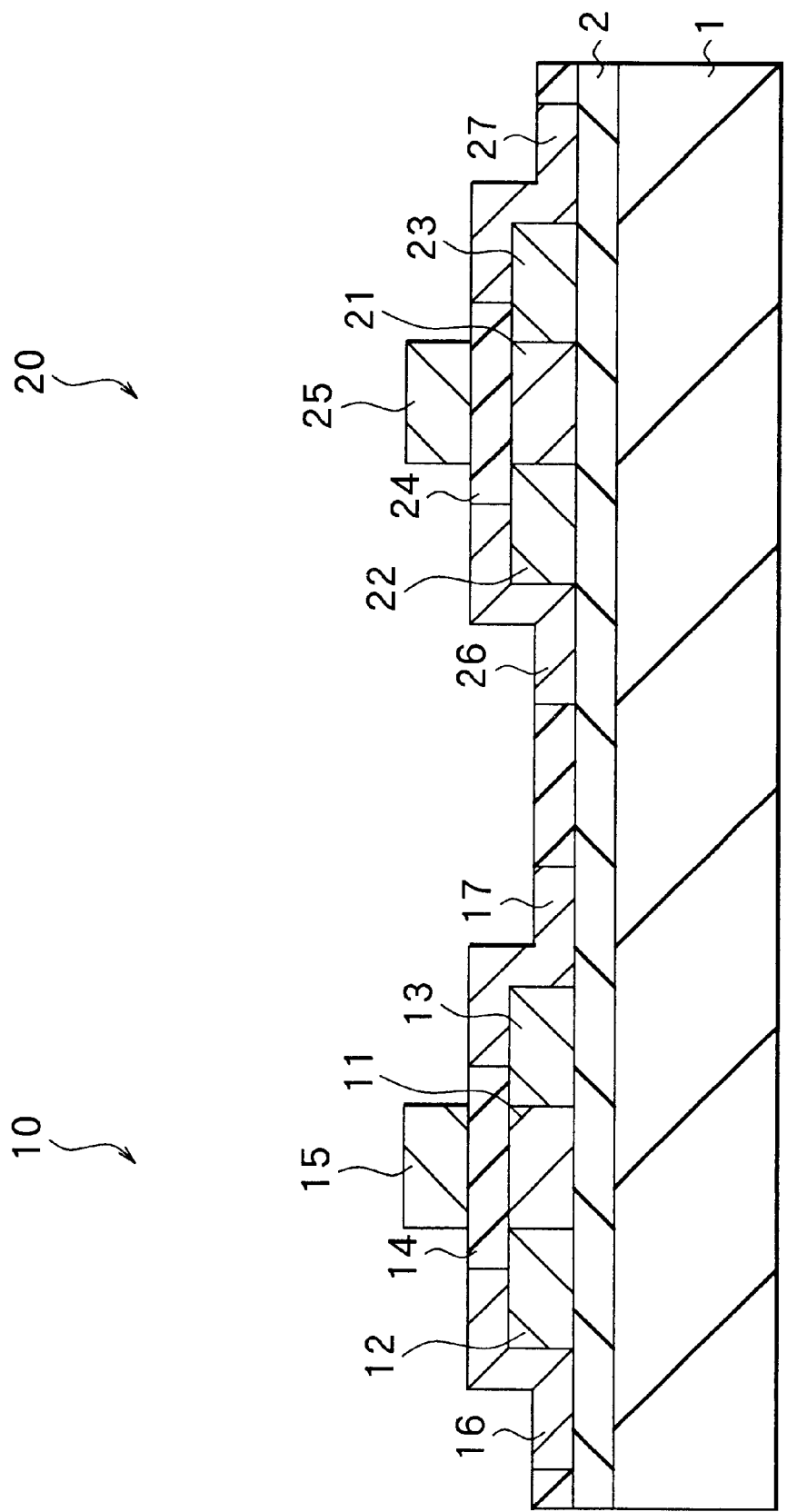
FIG. 1 is a sectional view of a semiconductor device according to an embodiment of the present invention.

Embodiments of the invention will now be described in detail below with reference to the accompanying drawings.
First Embodiment FIG. 1 shows a configuration of a semiconductor device according to a first embodiment of the invention. A semiconductor device shown in FIG. 1 comprises a CMOS (Complementary Metal Oxide Semiconductor) transistor formed on a substrate 1 with a buffer layer 2 in between. The CMOS transistor consists of a nMOS transistor 10 and a pMOS transistor 20. The nMOS transistor 10 and the pMOS transistor 20 are provided apart from each other on a surface of the buffer layer 2 away from the substrate 1.

The substrate 1 is made of glass such as quartz glass or non alkaline glass. The buffer layer 2 consists of a silicon nitride ($Si_3N_4$) layer and a silicon dioxide ($SiO_2$) layer, which are laid on the substrate 1 in the order named. The thickness of the silicon nitride layer in the direction of lamination hereinafter referred to simply as thickness) may be 100 nm. The thickness of the silicon dioxide layer may be 300 nm.

The nMOS transistor 10 comprises a conduction region 11 formed on the surface of the buffer layer 2, a source 12 provided next to the conduction region 11 on the surface of the buffer layer 2, a drain 13 provided apart from the source 12 and next to the conduction region 11 on the surface of the buffer layer 2.

The conduction region 11 works as a current path and is made of, for example, polycrystal silicon (Si) with no impurities added thereto. The source 12 and the drain 13 are made of, for example, polycrystal n-type silicon with n-type impurities such as phosphorus (P) added thereto. Polycrystals include so-called quasi-single crystals as described in the specification of Japanese patent application No. Hei 9-30552 (30552/1997). Quasi-single crystals refer to crystals made up of a plurality of approximately single crystal grains which are nearly oriented, each two grains next to each other almost providing lattice match at least in part of the grain boundary thereof.

Preferably, the thickness of the conduction region 11 is smaller than or equal to the average grain size of the conduction region 11. This is for reducing total trap number per unit area, thereby reducing leakage and enhancing inversion characteristics, that is, improving S value. Specifically, it is preferable that the thickness of the conduction region 11 be smaller than or equal to 80 nm. This is particularly for heating the conduction region 11 effectively in crystallizing the conduction region 11 by ELA. In the description given herein, the thickness of the conduction region 11 is 40 nm and the average grain size of the conduction region 11 is typically 1 $\mu$m. The source 12 and the drain 13 are of the same thickness as that of the conduction region 11.

Let the long diameter and short diameter of a grain of the conduction region 11 be x and y respectively. Then, the average grain size d may be given by:

$$d = \frac{\sum_n \sqrt{x \times y}}{n}$$

wherein n is the number of grains.

Figure 2:
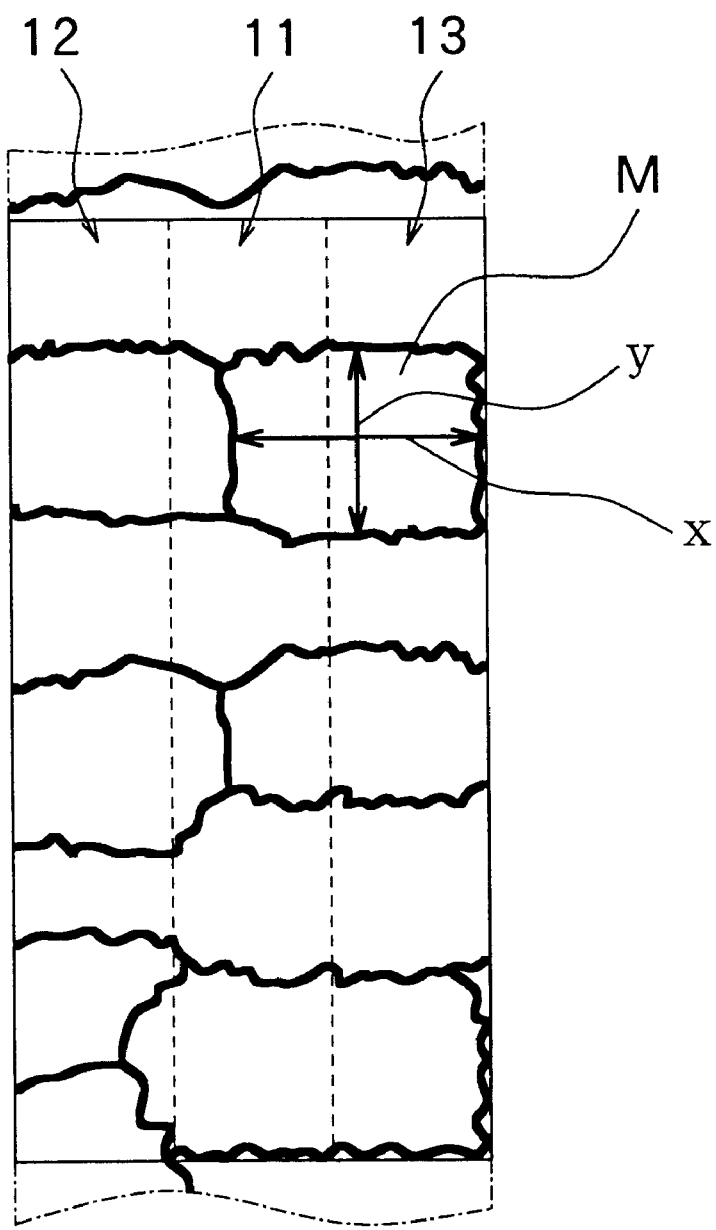
FIG. 2 is a plan view of the semiconductor device shown in FIG. 1.

Let a plane including a surface of the conduction region away from the substrate 1 be a reference plane. Then, the long diameter x and short diameter y of a grain are obtained as follows. FIG. 2 is a plan view of the conduction region 11 viewed from a position away from the substrate 1 and shows the crystals of the conduction region 11 on the reference plane. As shown in FIG. 2, the long diameter x equals to the length of the maximum diameter of a grain M on the reference plane, at least part of the grain M being included in the conduction region 11. The short diameter y equals to the length of the central perpendicular with respect to the long diameter of the grain M on the reference plane.

As shown in FIG. 1, the nMOS transistor 10 further comprises a gate electrode 15 provided on a surface of the conduction region 11 away from the buffer layer 2 with a gate insulating layer 14 in between. The gate electrode 15 and the gate insulating layer 14 are in non-ohmic contact. The gate insulating layer 14 is made of insulator such as silicon dioxide, silicon nitride or a compound of oxygen, nitrogen and silicon. The gate insulating layer 14 is thick enough for charges not to tunnel through easily; more than or equal to 50 nm, for example. In the description given herein, the thickness of the gate insulating layer 14 is 60 nm.

The gate electrode 15 is, for example, 40 nm thick and made of polycrystal p-type silicon germanium (SiGe) or polycrystal p-type germanium (Ge), with p-type impurities such as boron (B) added thereto. This is because the gate electrode 15 made of silicon germanium or germanium can be formed at lower temperatures, as compared to the case in which the gate electrode 15 is made of silicon, and therefore voltage reduction can be achieved. This is also because the Fermi level can be controlled so as to be around the center of the band gap of the conduction region 11 made of polycrystal silicon, and thereby an excellent driving characteristics can be achieved even if the gate electrode 15 is made of a semiconductor of the same conduction type as a gate electrode 25 of the pMOS transistor 20, which is to be described later.

Preferably, the gate electrode 15 is made of germanium or silicon germanium in which the ratio of germanium to silicon (hereinafter referred to as the germanium ratio) is more than or equal to 20 atomic %. More preferably, the gate electrode 15 is made of silicon germanium in which the germanium ratio is within the range from 30 atomic % to 90 atomic %, both inclusive. This is because the gate electrode 15 with a small germanium ratio can not be formed at low temperatures and therefore sufficient voltage reduction can not be achieved. This is also because the Fermi level can be controlled so as to be around the center of the band gap of the conduction region 11.

Preferably, the gate length of the gate electrode 15 is small so as to achieve speed-up and voltage reduction; specifically, it is preferable that the gate length be smaller than 0.5 $\mu$m. Moreover, the gate length of the gate electrode 15 is smaller than or equal to the average grain size of the conduction region 11, while the gate width of the gate electrode 15 is greater than the average grain size of the conduction region 11. Therefore, variations in characteristics is reduced even if the gate length is reduced. In order to reduce variations in characteristics much more, it is preferable that the gate width be greater than three times the average grain size of the conduction region 11. In order to reduce variations in characteristics even more, it is preferable that the gate width be greater than five times the average grain size of the conduction region 11.

Figure 3:
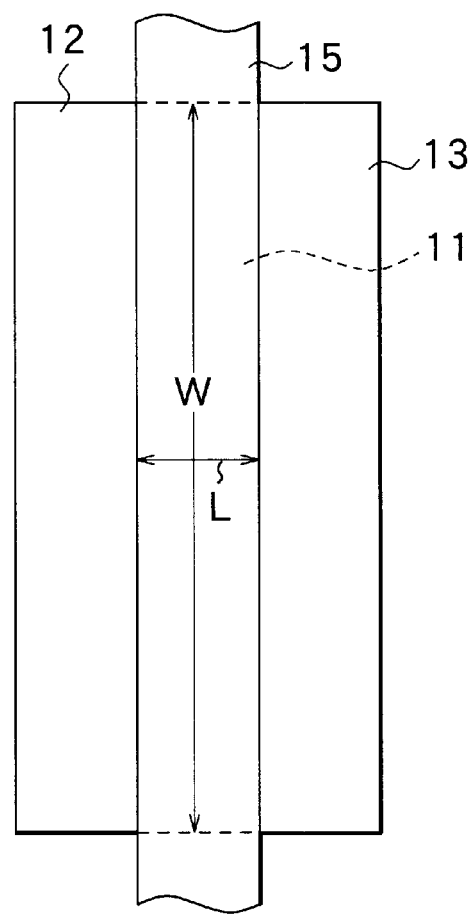
FIG. 3 is a plan view for explaining the gate length and gate width of a conduction region shown in FIG. 1.

In the description given herein, the gate length is 0.2 $\mu$m and the gate width is 2 $\mu$m. In FIG. 3, the gate length is designated by a reference character L, while gate width is designated by a reference character W; the reference character L refers to the length of the gate electrode 15 between the source 12 and the drain 13, while the reference character W refers to the width of the gate electrode 15 corresponding to the conduction region 11 in a direction vertical to the gate length. FIG. 3 is a plan view of the conduction region 11 viewed from above the gate electrode 15. The gate insulating film 14, a source electrode 16 and a drain electrode are omitted in FIG. 3.

As shown in FIG. 1, the nMOS transistor 10 further comprises a source electrode 16 electrically connected to the source 12 and a drain electrode 17 electrically connected to the drain 13. The source electrode 16 is made of a metal of low resistance such as aluminum (Al) or copper (Cu) and in ohmic contact with the source 12. The drain electrode 17 is made of a metal of the same type as the source electrode 16 and in ohmic contact with the drain 13.

The pMOS transistor 20 comprises a conduction region 21 formed on a surface of the buffer layer 2, a source 22 provided next to the conduction region 21 on the surface of the buffer layer 2, a drain 23 provided apart from the source 22 and next to the conduction region 21 on the surface of the buffer layer 2.

The conduction region 21 has the same configuration as the conduction region 11 of the nMOS transistor 10. The conduction region 21 is made of, for example, polycrystal silicon with no impurities added thereto. Preferably, the thickness of the conduction region 21 is smaller than or equal to the average grain size of the conduction region 21. The average grain size of the conduction region 21 may be given in the same manner as in the case of thre average grain size of the conduction region 11.

The source 22 has the same configuration as the source 12 except for the conduction type. The drain 23 has the same configuration as the drain 13 except for the conduction type. For example, the source 22 and the drain 23 are made of p-type silicon with p-type impurities such as boron added thereto.

The pMOS transistor 20 further comprises a gate electrode 25 provided on a surface of the conduction region 21 away from the buffer layer 2 with a gate insulating layer 24 in between. The gate insulating layer 24 has the same configuration as the gate insulating layer 14. The gate electrode 25 has the same configuration as the gate electrode 15.

The gate electrodes 15 and 25 are made of a semiconductor of the same conduction type. This has the advantage of simplicity of manufacturing process since the gate electrodes 15 and 25 can be formed at one time in one manufacturing step. On the other hand, the gate electrodes 15 and 25 are made of p-type semiconductor. This is for establishing ohmic contact between the witing and the gate electrode 15 or 25 easily. The gate length of the gate electrode 25 is smaller than or equal to the average grain size of the conduction region 21, while the gate width of the gate electrode 25 is greater than the average grain size of the conduction region 21.

The pMOS transistor 20 further comprises a source electrode 26 electrically connected to the source 22 and a drain electrode 27 electrically connected to the drain 23. The source electrode 26 has the same configuration as the source 16. The drain electrode 27 has the same configuration as the drain 17.

Figure 4:
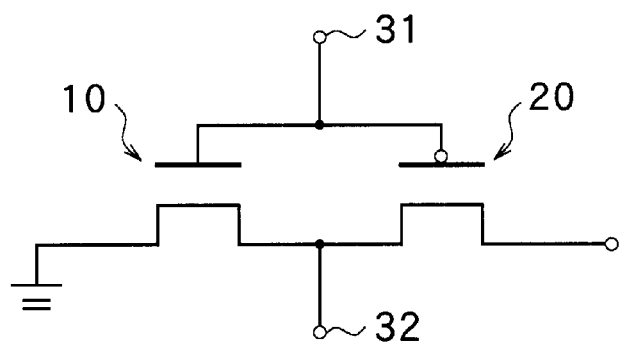
FIG. 4 is a circuit diagram showing the circuit configuration of the semiconductor device shown in FIG. 1.

FIG. 4 shows an example of the circuit configuration of the semiconductor device shown in FIG. 1. As seen from FIG. 4, in the semiconductor device, the nMOS transistor 10 and the pMOS transistor 20 form an inverter. The inverter inverts a signal inputted thereto from an input terminal 31 connected to both of the gate electrodes 15 and 25 of the respective transistors, and outputs the inverted signal from an output terminal 32 connected to both of the source and the drain of the respective transistors.

The operation of the semiconductor device is as follows.

If a voltage is applied to the gate electrode 15 in the nMOS transistor 10, a current flowing between the source 12 and the drain 13 is modulated. On the other hand, if a voltage is applied to the gate electrode 25 in the pMOS transistor 20, a current flowing between the source 22 and the drain 23 is modulated. In the embodiment, the gate length of the gate electrodes 15 and 25 is smaller than or equal to the average grain size of the conduction regions 11 and 21 respectively, while the gate width of the gate electrodes 15 and 25 is greater than the average grain size of the conduction regions 11 and 21, respectively, such that: $L \leq d < W$. Therefore, the semiconductor device exhibits the small range of variations in the relation between the gate voltage and the source-drain current even, if the gate length of the gate electrodes 15 and 25 is reduced. Also, the semiconductor device can operate accurately.

The manufacturing process of the semiconductor device is as follows.

Figure 5A:
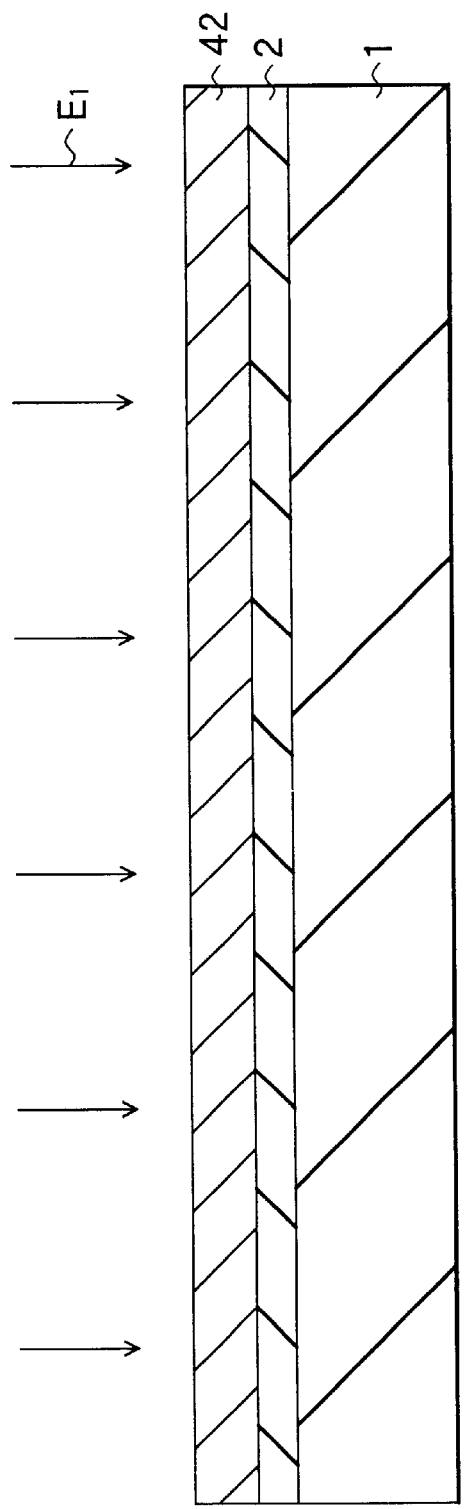
FIGS. 5A and 5B are sectional views showing processes of manufacturing the semiconductor devices shown in FIG. 1.

FIGS. 5 and 6 show the manufacturing steps of the semiconductor device. Firstly, as shown in FIG. 5A, on the substrate 1 made of glass, the buffer layer 2 is formed through laying a silicon nitride layer and a silicon dioxide layer in the order named by CVD (Chemical Vapor Deposition) or by sputtering. Next, on the buffer layer 2, a semiconductor layer 41 made of amorphous silicon is formed by plasma CVD or by sputtering, for example. The semiconductor layer 41 will be formed into the conduction regions 11 and 21, the sources 12 and 22, and the drains 13 and 23 in later steps.

If the semiconductor layer 41 is formed by plazma CVD, the semiconductor layer 41 is heated at temperatures above 400° C. for example or using the energy beam, thereby hydrogen contained in the semiconductor layer 41 is removed. Then, the semiconductor layer 41 is irradiated with an eximer lazer beam E1 having the energy density of 300 mJ/cm$^2$, thereby the semiconductor layer 41 is heated (ELA). Examples of the wave length of the eximer lazer beam are 308 nm of XeCl, 248 nm of KrF and 193 nm of ArF. This way, amorphous silicon which forms the semiconductor layer 41 is crystallized, and thus the semiconductor layer 41 is made of polycrystal silicon.

Figure 5B:
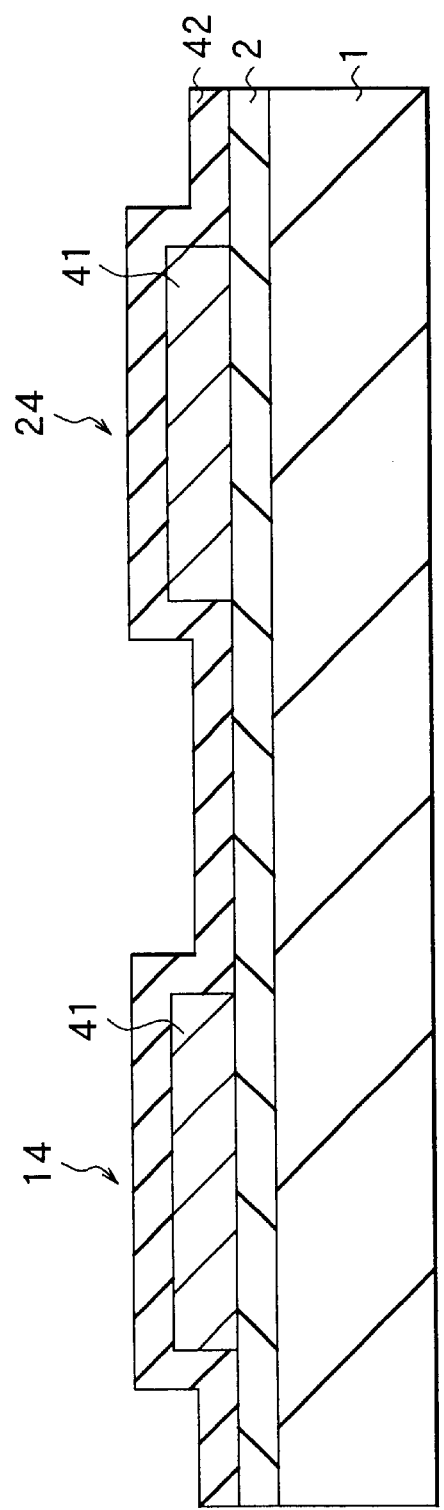

After being crystallized, as shown in FIG. 5B, the semiconductor layer 41 is selectively removed by etching except for the regions to be formed into the conduction regions 11 and 21, the sources 12 and 22, and the drains 13 and 23 by lithography, for example. Then, an insulating layer 42 made of silicon dioxide or silicon nitride is formed to spread across the same side of the buffer layer 2 as the semiconductor layer 41 by sputtering or by CVD, thereby the insulating layers 14 and 24 are formed.

Figure 6A:
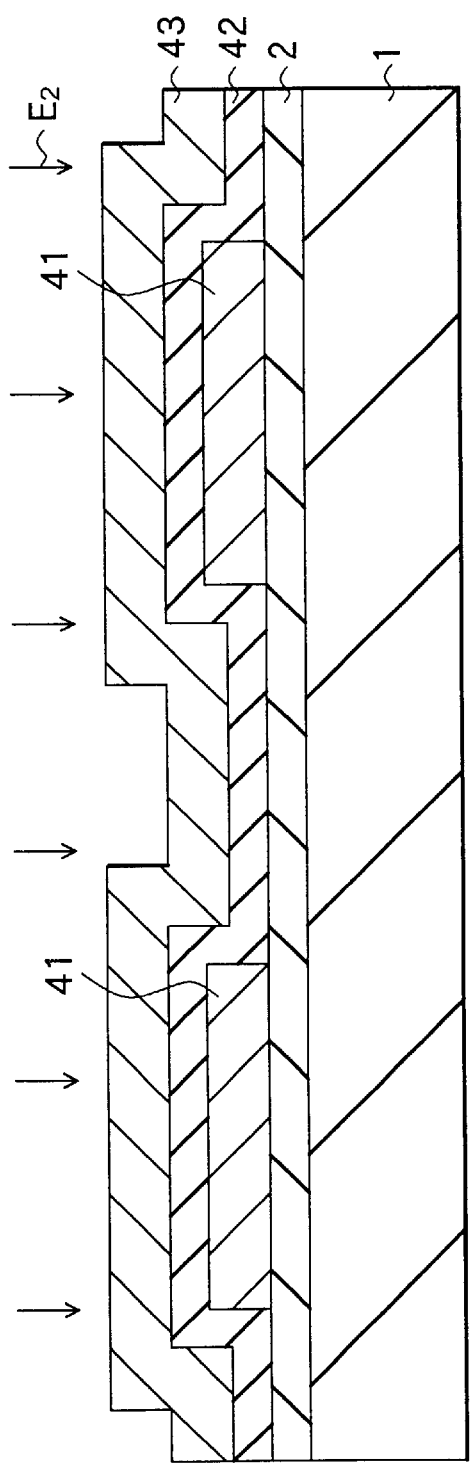
FIGS. 6A and 6B are sectional views showing processes following the processes shown in FIGS. 5A and 5B.

On the insulating layer 42, as shown in FIG. 6A, formed is a semiconductor layer 43 made of amorphous p-type silicon germanium or p-type germanium with p-type impurities added thereto, by plasma CVD or by sputtering, for example. If the semiconductor layer 43 is formed by plasma CVD, the semiconductor layer 43 is heated at temperatures above 400° C. or lamp annealing for example, thereby hydrogen contained in the semiconductor layer 43 being removed. Then, as in the case of the semiconductor layer 41, the semiconductor layer 43 is irradiated with an eximer lazer beam E2, thereby the semiconductor layer 43 is crystallized. The energy density of the eximer lazer beam E2 is set at 250 mJ/cm$^2$, which is smaller than in the case of crystallizing the semiconductor layer 41. This is because silicon germanium and germanium have lower melting points than silicon, and can be crystallized at lower temperatures.

Figure 6B:
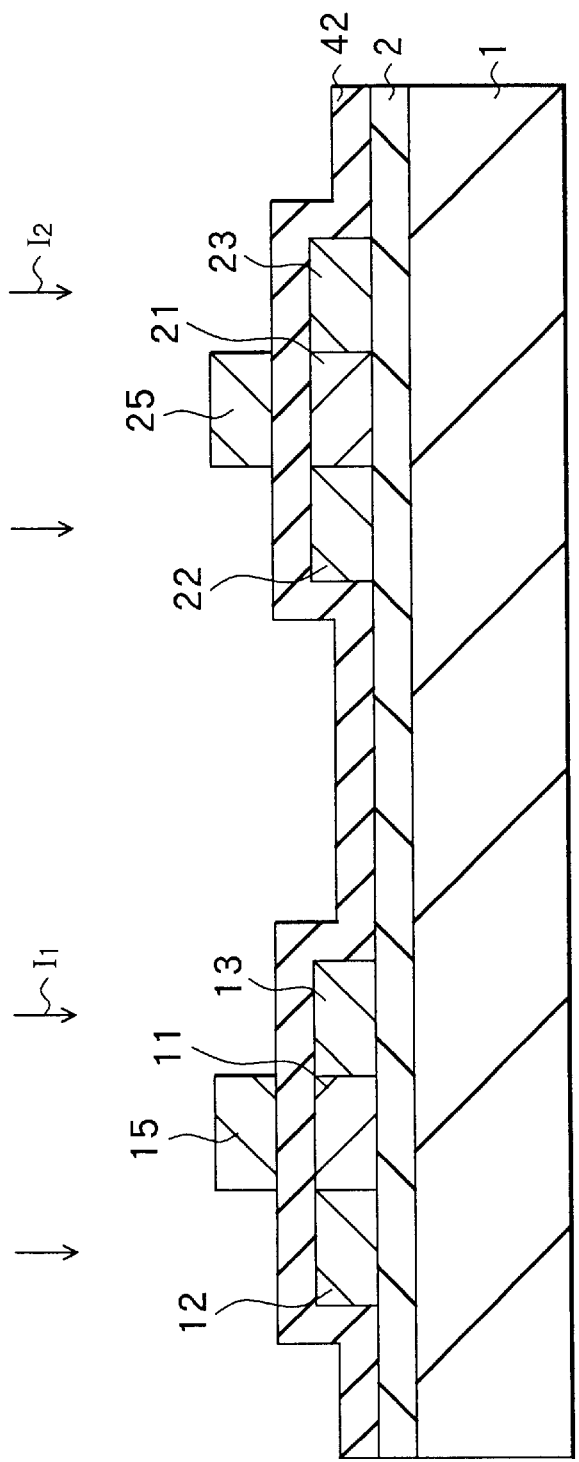

After being crystallized, as shown in FIG. 6B, the semiconductor layer 43 is selectively removed by etching, thereby the gate electrodes 15 and 25 are formed, by lithography, for example. Then, n-type impurities such as phosphorus is selectively implanted or doped by ion shower in the semiconductor layer 41 by ion implantation I1, thereby the source 12 and the drain 13 are formed, by lithography, for example. Thus, the conduction region 11 is formed between the source 12 and the drain 13. Next, p-type impurities such as boron is selectively implanted in the semiconductor layer 41 by ion implantation I2, thereby the source 22 and the drain 23 are formed, by lithography, for example. Thus, the conduction region 21 is formed between the source 22 and the drain 23. After that, impurities added to the sources 12 and 22, and the drains 13 and 23 are activated by ELA or by lamp heating, for example.

After impurities are activated, the insulating layer 42 is selectively removed and the sources 12 and 22, and the drains 13 and 23 are exposed in the surface of the wafer. Then the source electrodes 16 and 26, and the drain electrodes 17 and 27 are selectively formed corresponding to the sources 12 and 22, and the drains 13 and 23, respectively. The semiconductor device shown in FIG. 1 is thus completed.

As described above, according to the semiconductor device of the embodiment, the gate length of the gate electrodes 15 and 25 is smaller than or equal to the average grain size of the conduction regions 11 and 21 respectively, while the gate width of the gate electrodes 15 and 25 is greater than the average gram size of the conduction regions 11 and 21 respectively. Therefore, the semiconductor device exhibits the small range of variations in the relation between the gate voltage and the source-drain current even if the gate length is reduced. Also, the semiconductor device can operate accurately. As a result, gate length can be reduced and thus speed-up and voltage reduction can be achieved. Therefore., even the semiconductor device formed on the substrate 1 made of glass or the like can expect excellent characteristics. The semiconductor device according to the embodiment can be formed on the substrate 1 together with a LCD, an ELD (Electro-luminescence Display), a polymer display, a solar battery, a memory, a sensor array, an A/D converter, an interface or an operation circuit.

If the thickness of the conduction regions 11 and 21 is made smaller than or equal to the average grain size of the respective conduction regions, leakage can be reduced and inversion characteristic is improved. Also, the driving current can be made larger.

Furthermore, in the embodiment, the gate electrodes 15 and 25 are made of silicon germanium or germanium. Therefore, the gate electrodes 15 and 25 can be formed at lower temperatures, as compared to the case in which the gate electrode 15 and 25 are made of silicon. Also, voltage reduction can be achieved. Moreover, the Fermi level can be controlled so as to be around the center of the band gap of the conduction regions 11 and 21, which are made of polycrystal silicon. Thus, the semiconductor device can expect excellent driving characteristics even when the gate electrodes 15 and 25 are made of a semiconductor of the same conduction type. This has the advantage of simplicity of the manufacturing process.

In addition, the use of gate electrodes 15 and 25 made of germanium or silicon germanium in which the germanium ratio is more than or equal to 20 atomic % enhances the effect obtained. In particular, if the gate electrodes 15 and 25 are made of silicon germanium in which the germanium ratio is within the range from 30 atomic % to 90 atomic %, both inclusive, the semiconductor device can expect even more excellent driving characteristics when the gate electrodes 15 and 25 are made of a semiconductor of the same conduction type.

Furthermore, forming the gate electrodes 15 and 25 made of a semiconductor of the same conduction type contributes to simplicity of the manufacturing process. In addition, forming the gate electrodes 15 and 25 made of a p-type semiconductor enables easy establishment of ohmic contact between the wiring and the gate electrodes 15 or 25.

Second Embodiment

The semiconductor device according to a second embodiment of the invention is of essentially the same configuration, operation and effects as the first embodiment as described above with reference to FIGS. 1 to 6B, except that the substrate 1 is made of plastics in the second embodiment. Thus the like reference numerals are given to the like elements and the description thereof will be omitted.

In the semiconductor device according to the embodiment, the substrate 1 is made of plastics, which has lower melting point as compared with glass. It is therefore preferable that the buffer layer 2 is made thicker than in the first embodiment, in order to prevent the effects of ELA in the manufacturing process on the substrate 1 (see FIG. 1). To be specific, it is preferable that the thickness of the silicon dioxide layer, which forms the buffer layer 2, is more than or equal to 500 nm, or more preferably more than or equal to 1 µm.

Also, it is desirable that the conduction regions 11 and 21, the sources 12 and 22, and the drains 13 and 23 (see FIG. 1) are made of silicon germanium or germanium. This is for forming the conduction regions 11 and 21, the sources 12 and 22, and the drains 13 and 23 at a lower temperature as compared to the case in which silicon is utilized.

The semiconductor device as thus configured can be manufactured in the same manner as in the first embodiment, with the following exceptions: the semiconductor layers 41 and 43 (see FIGS. 5A and 6A) should be deposited at temperatures below 250° C. if the semiconductor layers 41 and 43 is formed by CVD; the step of removing hydrogen from the semiconductor layers 41 and 43 should be performed by ELA of low energy density.

As described above, in the semiconductor device, the buffer layer 2 is made thicker. Thus, the effects of ELA in the manufacturing process on the substrate 1 can be prevented. Besides, the conduction regions 11 and 21, the sources 12 and 22, and the drains 13 and 23 are made of silicon germanium. This enables the conduction regions 11 and 21, the sources 12 and 22, and the drains 13 and 23 to be formed at a low temperature. Therefore, the conduction regions 11 and 21, the sources 12 and 22, and the drains 13 and 23 can be formed on the substrate 1 made of plastics. This contributes to cost reduction.

The invention has been described with reference to the preferred embodiments thereof. The invention however is not to be limited to the embodiments and various changes and modifications are possible. For example, the embodiments as described above relate to semiconductor devices having CMOS transistors, but the invention is broadly applicable to semiconductor devices which comprises a source and a drain provided apart from each other, a conduction region provided next to both of the source and the drain, and a gate electrode associated with the conduction region. In other words, the invention is applicable to semiconductor devices having transistors such as transfer gates, switches, sensor amplifiers, buffer memories, A/D converters, differential amplifiers and shift resistors.

Also, the first embodiment as described above relates to the case in which the conduction region 11, the source 12 and the drain 13 are made of silicon. However, the conduction region 11, the source 12 and the drain 13 may be made of silicon germanium as in the second embodiment.

Moreover, the embodiments as described above relate to the case in which the gate electrodes 15 and 25 are made of a polycrystal semiconductor, but the gate electrode 15 and 25 may be made of other non-single crystal semiconductor such as amorphous, or a metal of low resistance such as aluminum or copper.

In addition, in the embodiments as described above, the buffer layer 2 is formed through laying a silicon nitride layer and a silicon dioxide layer in the order named. The buffer layer 2 however may be formed either one of a silicon nitride layer and a silicon dioxide layer. The buffer layer 2 may be formed of other insulating layer such as a layer made of a compound of oxygen, nitrogen and silicon.

Furthermore, in the embodiments above, the substrate 1 is made of glass or plastics, but the substrate 1 may be made of other materials such as single crystal silicon. The substrate 1 may be an inexpensive substrate formed through depositing a silicon dioxide layer on a surface of a silicon wafer.

In addition, the embodiments disclose the semiconductor device formed on the substrate 1 with the buffer layer 2 in between, but the semiconductor device may be formed on another semiconductor device with an insulating film in between.

As described above, according to the semiconductor device of the invention, the gate length of the gate electrode is smaller than or equal to the average grain size of the conduction region, while the gate width of the gate electrode is greater than the average grain size of the conduction region. Therefore, the semiconductor device exhibits the small range of variations in characteristics and operates accurately even if gate length is reduced. As a result, gate length can be reduced and thus speed-up and voltage reduction can be achieved. Therefore, the semiconductor device can expect excellent characteristics even if the semiconductor device is formed on a substrate made of glass, plastics or the like, or an inexpensive substrate formed through depositing a silicon dioxide layer on a surface of a silicon wafer. The semiconductor device according to the embodiment can be formed on the substrate 1 together with a LCD, an ELD, a polymer display, a solar battery, or other semiconductor devices of different characteristics.

Especially, according to the semiconductor device of one aspect of the invention, the gate electrode is made of silicon germanium and germanium. Therefore, the gate electrode can be formed at lower temperatures, as compared to the case in which the gate electrode is made of silicon. Also, voltage reduction can be achieved.

Furthermore, according to the semiconductor device of one aspect of the invention, gate electrodes of a pair of semiconductor elements are made of a semiconductor of the same conduction type. This contributes to simplicity of the manufacturing process.

In addition, according to the semiconductor device of one aspect of the invention, gate electrodes of a pair of semiconductor elements are made of a p-type semiconductor. This enables easy establishment of ohmic contact between the wiring and the gate electrodes.

Moreover, according to the semiconductor device of one aspect of the invention, gate electrodes of a pair of semiconductor elements are made of silicon germanium or germanium. Therefore, the semiconductor device can expect excellent driving characteristics, even if the gate electrodes are made of a semiconductor of the same conduction type.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
a substrate made of one of glass and plastic
a source provided over the substrate;
a drain provided over the substrate and apart from the source;
a conduction region which is made of laser-annealed polycrustal semiconductor and provided next to both of the source and the drain; and
a gate electrode associated with the conduction region, the gate electrode is made of one of silicon germanium and germanium, a gate length of the gate electrode being smaller than or equal to an average grain size of the conduction region, while a gate width of the gate electrode being greater than three times the average grain size of the conduction region.

2. A semiconductor device according to claim 1, wherein the laser-annealed polycrystal semiconductor is made of one of silicon, silicon germanium, and germanium.

3. A semiconductor device according to claim 1, wherein the gate electrode is made of silicon germanium in which a ratio of germanium to silicon is more than or equal to 20 atomic %.

4. A semiconductor device according to claim 1, wherein the gate electrode is made of silicon germanium in which a ratio of germanium to silicon is within a range from 30 atomic % to 90 atomic %, both inclusive.

5. A semiconductor device according to claim 1, wherein the gate electrode is made of one of laser-annealed silicon germanium and laser-annealed germanium.

6. A semiconductor device according to claim 1, wherein the source, the drain, the conduction region, and the gate electrode form a pair of complementary semiconductor elements.

7. A semiconductor device according to claim 6, wherein the gate electrodes of the semiconductor elements are made of a semiconductor of the same conduction type.

8. A semiconductor device according to claim 7, wherein the gate electrodes of the semiconductor elements are made of a p-type semiconductor.

9. A semiconductor device according to claim 8, wherein the gate electrodes of the semiconductor elements are made of silicon germanium or germanium.

10. A semiconductor device comprising:
a substrate;
a gate electrode;
a source;
a drain; and
a conductive region disposed associated with the gate electrode and disposed on the substrate between the source and the drain,
wherein the conductive region defines a thickness t and includes a plurality grains n, wherein a plane is defined above the substrate through a first grain,
wherein the first grain defines a first diameter x on the plane and a second diameter y on the plane, and
wherein the first diameter x is the maximum diameter of the first grain on the plane and the second diameter y equals the diameter disposed at a midpoint of the first diameter perpendicular such that the grain size d complies with the formula $$d = \sum_n \sqrt{x*y}\,/n$$

and such that $t \leq d$.

11. The semiconductor device of claim 10, wherein the gate electrode defines a gate length L such that $L \leq d$.

12. The semiconductor device of claim 10, wherein the gate electrode defines a gate width W such that $d < W$.

13. The semiconductor device of claim 12, wherein the gate electrode further defines a gate length L such that $L \leq d$.

14. The semiconductor device of claim 10 wherein the substrate is made of glass.

15. The semiconductor device of claim 10 further comprising:
a buffer layer disposed between the substrate and the conductive region, wherein $t < d$.

16. An inverter comprising:
a substrate;
at least two gate electrodes including a first gate electrode and a second gate electrode;
an n-type source and a p-type source;
a first drain and a second drain; and
at least two conductive regions including a first conductive region and a second conductive region,
wherein the first conductive region is disposed associated with the first gate electrode and is disposed on the substrate between the n-type source and the first drain, wherein the second conductive region is disposed associated with the second gate electrode and is disposed on the substrate between the p-type source and the second drain, wherein each conductive region defines a thickness t and includes a plurality grains n, wherein a plane is defined above the substrate through a first grain, wherein the first grain defines a first diameter x on the plane and a second diameter y on the plane, and wherein the first diameter x is the maximum diameter of the first grain on the plane and the second diameter y equals the diameter disposed at a midpoint of the first diameter perpendicular such that the grain size d complies with the formula $$d = \sum_n \sqrt{x*y}/n$$

and such that, for at least t, $t \leq d$.

17. The inverter of claim 16, wherein the gate electrode defines a gate length L such that $L \leq d$.

18. The inverter of claim 16, wherein the gate electrode defines a gate width W such that $d<W$.

19. The inverter of claim 18, wherein the gate electrode further defines a gate length L such that $L \leq d$.

20. The inverter of claim 16 further comprising:
a buffer layer disposed between the substrate and the conductive region, wherein $t<d$.

* * * * *